United States Patent
Watanabe et al.

[11] Patent Number: 5,906,912
[45] Date of Patent: May 25, 1999

[54] PROCESSES FOR FORMING RESIST PATTERN AND FOR PRODUCING SEMICONDUCTOR DEVICE

[75] Inventors: Keiji Watanabe; Miwa Igarashi; Ei Yano; Keiko Yano; Takashi Maruyama; Eiichi Hoshino; Kotaro Shirabe; Masafumi Nakaishi, all of Kawasaki, Japan

[73] Assignee: Fujitsu Limited, Kanagawa, Japan

[21] Appl. No.: 08/834,044

[22] Filed: Apr. 11, 1997

[30] Foreign Application Priority Data

Apr. 12, 1996 [JP] Japan .................................... 8-091230

[51] Int. Cl.$^6$ ...................................................... G03C 5/00
[52] U.S. Cl. .......................... 430/317; 430/313; 430/318; 430/319; 430/272.1; 430/286.1; 216/67; 438/197; 438/585; 438/725
[58] Field of Search .................................... 430/313, 317, 430/318, 319, 272.1, 286.1; 216/67; 438/197, 585, 725

[56] References Cited

U.S. PATENT DOCUMENTS

| | | | |
|---|---|---|---|
| 4,572,764 | 2/1986 | Fan | 156/630 |
| 4,670,097 | 6/1987 | Abdalla et al. | 156/659.1 |
| 5,332,653 | 7/1994 | Cullen et al. | 430/323 |
| 5,612,241 | 3/1997 | Arima | 437/52 |
| 5,776,659 | 7/1998 | Watanabe et al. | 430/296 |

FOREIGN PATENT DOCUMENTS 4-181254  6/1992  Japan .

OTHER PUBLICATIONS

J. Appl. Phys., vol. 44, No. 9, Sep. 1973, (Fundamental Aspects of Electron Beam Lithography. 1. Depth–dose Response of Polymeric Electron Beam Resists) by R. D. Heidenreich, et al.

J. Vac. Sci. Technol.B 8(6), Nov./Dec. 1990, (Resist Heating Effects in 25 and 50 kV e–beam Lithography on Glass Masks) by E. Kratschmer, et al.

J. Vac. Sci. Technol.B 10(6), Nov./Dec. 1992, (Fast Proximity Effect Correction Method using a Pattern area Density Map) by Fumio Murai, et al.

*Primary Examiner*—Nam Nguyen
*Assistant Examiner*—Steven H. Versteeg
*Attorney, Agent, or Firm*—Armstrong, Westerman, Hattori, McLeland & Naughton

[57] ABSTRACT

An electroconductive pattern is formed by coating a substrate with a solution comprising 100 parts by weight of a soluble electroconductive polymer containing an organic radical capable of cross-linking with a cross-linking agent, 5 to 1,000 parts by weight of a cross-linking agent, and 100 to 100,000 parts by weight of a solvent; effecting cross-linking of the resultant coated film to obtain a cured electroconductive film having a sheet resistance of $10^{10}$ Ω/□ or less; forming a pattern as an upper layer on the cured electroconductive layer; and transferring the pattern of the upper layer to the cured electroconductive layer.

33 Claims, 7 Drawing Sheets

PROCESSES FOR FORMING RESIST PATTERN AND FOR PRODUCING SEMICONDUCTOR DEVICE

FIELD OF THE INVENTION

The invention relates to a process for forming a multilevel resist pattern and a process for producing a reticle and a semiconductor device applying the process set forth above.

DESCRIPTION OF RELATED ART

In the formation of a semiconductor integrated circuit (IC), technologies of forming a thin film and of lithography are frequently applied, and the improvements in these technologies have resulted in the formation of miniaturized semiconductor unit elements and realization of practical utilizations of integrated circuits, e.g., LSI, VLSI and ULSL.

Referring to the wiring technology, there is realized a process which comprises the steps of:

(1) forming a thin film made of a material adapted for use in forming a wiring on the substrate to be treated;

(2) coating the thin film with a photosensitive material, i.e., so-called a resist;

(3) selectively changing the solubility of the resist material either by exposing the film with a mask to visible light, ultraviolet ray, superultraviolet ray or X-ray, or by directly scanning the film with an electron beams having a reduced diameter;

(4) effecting development to form a resist pattern; and (5) effecting dry etching or wet etching with the formed resist pattern as a mask to form wiring patterns.

In a process for producing a semiconductor element, e.g., ULSI, it is necessary to construct a multilayered circuit. When a wiring pattern or the like is already formed as the underlying layer, a step of about 1 $\mu$m in depth is apt to be formed on the surface of an overlying insulating layer. In such a case, if the prior art process for forming a single layered resist is applied, it is not possible to precisely form a fine pattern at a high resolution, due to the reflection from the step and the wiring material.

During the exposure effected by the electron beam, it is not possible to form a fine pattern with a high accuracy, because of the misalignment, i.e., dislocation of pattern between shot points due to the charge-up resulted from the insulating resist material and of the proximity effect resulted from the electron scattering. Particularly, in the case for producing a reticle, this problem becomes evident due to the thick thickness of the silica substrate.

When the electron scanning method is applied for the production of a reticle, the thermal conductivity of the silica substrate is very small as compared with that of a silicon wafer substrate. Therefore, as taught by E. Kratschmer and T. R. Groves, in J. Vac. Technol. B8, 1898 (1990), the thermal energy generated by the collision of electron beam, which passed through a resist layer, with the surface of a silica substrate or the interface of a light-shielding Cr film, assists the energy of exposure, and thus it is not possible to execute patterning as exact as scanned by the electron beam.

In order to reduce such an influence, it is effective that the accelerating voltage of electron beam is lowered. However, as described by R. D. Heidenreich et al. in J. Appl. Phys., Vol. 44, No. 9, September, 4039 (1973), when the accelerating energy is lowered, the scattering of electrons from the substrate generally becomes more effective and the electron beam energy diffuses even into an unnecessary region. Such a problem also occurs in the production of a reticle. As recited in SEMI Japan, STEP/Micropatterning, '93, 75 (1993), the effect of electron scattering caused by a light-shielding Cr film or a silica substrate has been a problem in the formation of fine patterns. In order to control such effect, it is necessary to preliminarily prepare exposure data which includes corrected pattern data. As shown by Fumio Murai et al., in J. Vac. Sci. Technol. B, Vol. 10, No. 6, November/December, 3072 (1992), it is required to increase the numbers of exposure data and the length of scanning time, in order to obtain such data for correction.

Furthermore, when various wiring layers and their interconnection via(s) are formed in the semiconductor IC's, the applied plasma etching may cause a problem, in which a thin gate oxide film is damaged due to local charge up. This problem is caused by layout of an integrated circuit. Such an effect is evident in a processor in which high capacity CMOS gates are interconnected by means of a number of long wires.

SUMMARY OF THE INVENTION

The objects of the invention are to remove all of the problems in the prior art patterning process.

That is, an object of the invention is to prevent the decrease of patterning accuracy caused by a step in the substrate and the influence of reflection on the substrate. Another object of the invention is to inhibit the decrease of patterning accuracy which is caused by the dislocation of patterns and the adjacency effect due to charge up by electron beam, which are evident particularly in the production of a mask. Still another object of the invention is to avoid damage to gate oxide layer due to deviation of charge up in the etching step of producing semiconductor IC.

According to the invention, there is provide a process for forming a pattern, comprising the steps of:

coating a substrate with a solution comprising 100 parts by weight of a soluble electroconductive polymer containing an organic radical capable of cross-linking with a crosslinking agent, 5 to 1,000 parts by weight of a crosslinking agent, and 100 to 100,000 parts by weight of a solvent as essential ingredients;

crosslinking the resultant coated film to obtain a cured electroconductive film having a sheet resistance of $10^{10}$ $\Omega/\square$ or less;

forming a pattern as an upper layer on the cured electroconductive film; and then, transferring the pattern of the said upper layer to the electroconductive cured film.

The cured film should be resistant to solvent, by which the coated film is not invaded during the coating and developing steps in patterning the upper layer. The electroconductive polymers to be applied in these steps are those, which are soluble materials capable of being spin coated and having $10^{10}$ $\Omega/\square$ or less of sheet resistance after the polymers are cured.

The cross-linking agents are not particularly restricted, unless they do not separate in phase from the electroconductive polymers. It is an important requirement that the solubility before coating reconciles with the solvent-resistance and electroconductivity after curing. The combination of a soluble electroconductive polymer having a sulfonic group and polyvinyl alcohol as a cross-linking agent is particularly preferable. Such electroconductive polymers having a sulfonic group exhibit a high solubility in water and a solvent having a high polarity, and begin curing reaction when mixed with polyvinyl alcohol and heated to a temperature of 120° C. to 300° C. to improve their solvent-resistance. It is also possible to accelerate the curing reaction by effecting exposure on the entire surface. In such a case, it is possible to preferably use an azide compound having sulfonic group as a crossing agent.

It is preferable to use an electroconductive polymer, as disclosed in Japanese Unexamined Patent Publication No. 5-324237, e.g., sulfonated polyaniline, sulfonated polyparaphenylene vinylene, sulfonated polythiophene vinylene, sulfonated polyfuran vinylene, sulfonated polypyrrole vinylene, sulfonated polythiophene, sulfonated polyfuran, sulfonated polyselenophenone, sulfonated polypyrrole, sulfonated poly-p-phenylene sulfide and sulfonated poly (halogenated alkylstyrene), more preferably sulfonated polyaniline and sulfonated polythiophene, and particularly poly(aminoanisole sulfonic acid). The sulfonated polymers may be applied as a mixture thereof. The sulfonation degree is preferable in the range of 20% to 100%.

The soluble electroconductive polymers are described in U.S. patent application Ser. Nos. 08/279,210 and 08/542,193, the disclosures of which are incorporated herewith by reference.

The molecular weight of the polymer is preferably in a range of 5000 to 5,000,000.

The amount of 5 to 1,000 parts by weight, preferably 10 to 200 parts by weight of a cross-linking agent is used per 100 parts by weight of an electroconductive polymer. If the amount of a cross-linking agent is more than this range, the electroconductivity of the mixture is reduced, and if it is less than this range, its solvent-resistance does not become sufficient.

Polyvinyl alcohol and its copolymers may be preferably used, when their polymerization degree is 100 to 2000, and their sulfonication degree is 50 to 100%.

Although the solvents are not particularly limited, so far as the compound can dissolve both of the electroconductive polymer and polyvinyl alcohol at the same time, water, alcohols or a mixture thereof may be preferably applied. The amount of 100 to 100,000 parts by weight of such a solvent is used per 100 parts by weight of an electroconductive polymer. A practical thickness and suitable properties of the film cannot obtained if the amount of solvent does not fall within this range.

It is also possible to add 0.01 to 50 parts by weight of a surfactant per 100 parts by weight of the electroconductive polymer set forth above.

Such a solution of an electroconductive polymer is crosslinked and cured by irradiation with a radioactive ray or by thermal treatment. The characteristic features of the invention reside in cross-linking between a soluble electroconductive polymer by a cross-linking agent so as to provide them with solvent-resistance, and at the same time to maintain electroconductivity. In order to form such a crosslinking, irradiation with a radioactive ray or a thermal treatment at a temperature of about 120 to 300° C. is used.

The obtained cured solvent-restant electroconductive film exhibits a sheet resistance of $10^{10}$ Ω/□ or less, preferably $10^7$ Ω/□ or less. Those having a sheet resistance of $10^7$ to $10^5$ Ω/□ as well as solvent-resistance can be surely obtained.

Although the thickness of the film is not particularly restricted, it is generally about 2 μm or less, but a film having a thickness in the order of 0.4 μm can also be applied.

As a process for forming a pattern of an upper layer on the formed electroconductive film, it is not particularly limited, if a pattern is formed to play a mask for transferring the exposed image to the under layer. Two-layer resist process can be preferably applied, in which a resist is coated and subjected to, exposure, and development, which pattern is transferred to the electroconductive film. Although the resist of the upper layer is not particularly limited, a silicon-containing resist having dry etching resistance ten times or more as strong as the underlayer is preferred.

Particularly, a resist having the following general formula (1) is preferably applied:

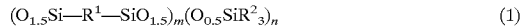

$$(O_{1.5}Si\text{—}R^1\text{—}SiO_{1.5})_m(O_{0.5}SiR^2{}_3)_n \quad (1)$$

wherein $R^1$ represents lower arylene or alkylene, $R^2$ represents lower alkyl, lower aryl, lower alkenyl, lower aralkyl, halogenated alkyl, halogenated aryl, halogenated arylalkyl, and halogenated aralkyl, which may be the same radicals or different radicals.

The thickness of the upper layer is preferably one tenth or less of the thickness of the lower layer or the electroconductive layer.

A three-layer process is also preferably applied, which comprises coating the electroconductive film with a silicon-containing resin and thereon with a photosensitive resin composition, and subjecting the coated photosensitive resist to exposure and development to pattern the photosensitive resin layer, and then transferring the pattern of the photosensitive resin layer to the silicon-containing resin which pattern is then transferred to the electroconductive film.

It is noted that even a photoresist or electron beam resist layer may be used as an upper layer although it does not have a high etching resistance in comparison with the electroconductive layer, since it can be still used as a mask.

As a light source for use in the exposure, an electron beam is preferably applied, in addition, ultraviolet ray, KrF exima laser, ArF exima laser, or X rays may also be applied.

The transferring of the upper layer pattern to the electroconductive solvent-resistant cured film may be preferably effected by plasma etching with an oxygen containing gas.

The process for forming a pattern according to the invention is useful in the production of a reticle. The reticle is formed by the process, in which a single layer or plural layers of either a metal of Cr, Mo, etc. or an oxide or nitride or silicide thereof is formed on a silica substrate, and patterned. When an electron beam is applied for forming a pattern on the rectile, the process for forming pattern according to the invention can be usefully applied.

Furthermore, the invention provides a process for producing a semiconductor device, comprising the steps of:

forming a gate electrode of a MOS transistor;

coating the gate electrode with an insulating layer, and forming an opening in the insulating layer, so as to form electrical connection with the gate electrode;

coating a first film comprising an electroconductive material or a metal which is electrically connected with the gate electrode through the opening; and, etching the first film with a resist formed on the first film, as an etching mask, to form an interconnection made of the first film, wherein said resist is patterned by the process for forming a pattern as set forth above.

The description of preferred embodiments of the invention will be described in detail.

The invention can realize an electroconductive underlayer superior in chemical resistance, and thus it makes it possible to form electroconductive patterns in various multi-layered resist processes using such an electroconductive underlayer.

Therefore, the invention can resolve all the problems suffered in the prior art patterning process, such as:

① the decrease of patterning accuracy caused by the step difference in the substrate and the influence of reflection on the substrate;

(2) the decrease of patterning accuracy which is caused by the dislocation of patterns and the adjacency effect due to charge up of electron beams, which are evident particularly in the production of a mask; and (3) the damage of the gate oxide layer due to deviation of charge up in the etching step of producing a semiconductor IC.

Therefore, the invention remarkably contributes to form micropatterns in electron circuit elements and rectiles, thereby improving the yield and also the reliability of produced semiconductor elements.

DESCRIPTION OF PREFERRED EMBODIMENTS OF THE INVENTION

EXAMPLE 1

Figure 1:
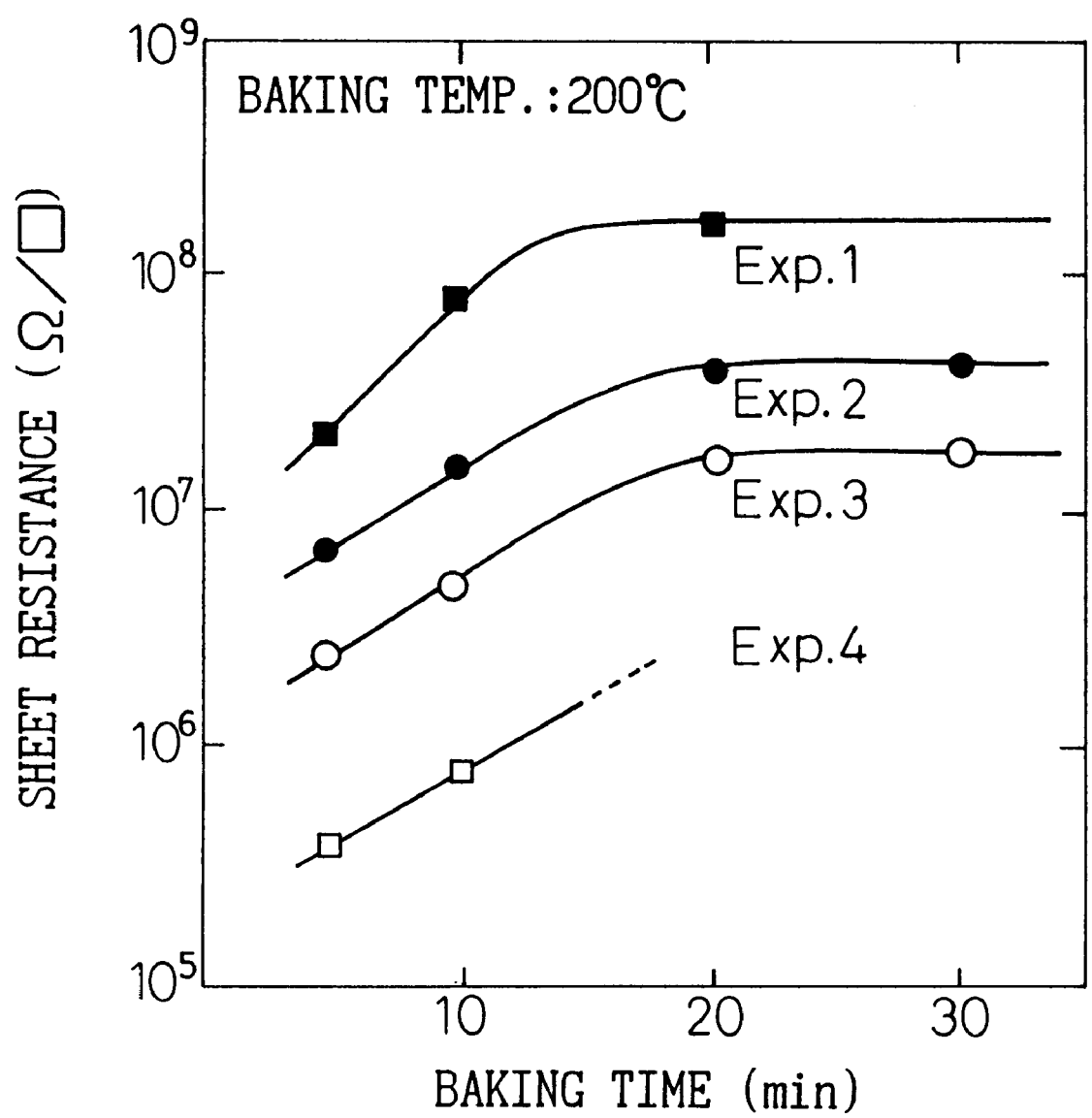
FIG. 1 illustrates the relationship between the baking time and the electroconductivity obtained in the Examples.

A substrate was coated with a 5 nm-thick chromium oxide layer, a 60 nm-thick pure chromium layer and a 30 nm-thick chromium oxide layer, and then with an electroconductive composition consisting of 50 parts by weight of polyaminoanisole sulfonic acid (Mw=330,000), 50 parts by weight of polyvinyl alcohol (polymerization degree 500, sulfonification degree 89%), 1,000 parts by weight of water and 10 parts by weight of a surfactant (polyoxyethylene phenyl ether, polymerization degree 8) to form a planalizing layer of 2 $\mu$m in thickness. The substrate was baked at 200° C. for 5 minutes. The resulted film was cured to form cross-linking and exhibited solvent-resistance, and a sheet resistance of $5 \times 10^5$ $\Omega/\square$.

Polyaminoanisole sulfonic acid has the following chemical formula.

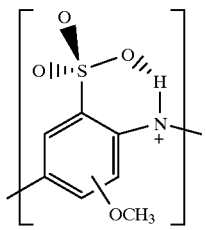

The electroconductive solvent-resistant cured layer was coated with a methyl ethyl ketone solution of a silicon-containing resist (Mw=10,000, molecular weight dispersion Mw/Mn=1.2, synthesized according to the method disclosed in Japanese Unexamined Patent No. 4-181254) having the following formula, as a 0.2 $\mu$m thick upper resist layer:

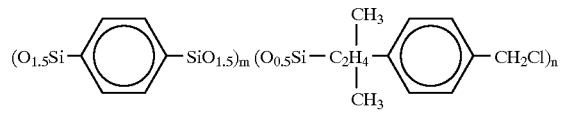

The coated resist was prebaked at 90° C. for 1 minute, and exposed to an electron beam having 30 kV of accelerating voltage with an exposing density of 16 $\mu$C/cm$^2$. Then, the exposed resist was developed with an organic developing solution and rinsed with alcohol, and a line and space of 1.0 to 0.1 $\mu$m was patterned only in the upper layer.

Thereafter, a double layered pattern was formed by transfer-etching the planalizing layer, under the following conditions:

| | |
|---|---|
| gas pressure | 20 mTorr, |
| applied frequency | 13.56 MHz, |
| flow rate of oxygen | 20 sscn |
| rf power | 0.16 W/cm$^2$ | by means of DEM-451 dry etching apparatus.

No dislocation of the electron beam at the field connecting zone and no strains of image due to approaching effect were observed, and patterns of 0.1 $\mu$m in width were resolved, by observation by scanning electron microscopy.

Furthermore, a reticle was produced by means of the same dry etching apparatus, while halogenated hydrocarbon was applied instead of oxygen, as the reaction gas, and the resist pattern was transferred to a chromium layer, and the resist was stripped by rinsing with pure water.

Although, the example set forth above relates to patterning of a chromium oxide/pure chromium/chromium oxide film, a half-tone reticle could be produced, when a silica substrate, on which a chromium oxide film and a MeSiON film were formed, was similarly patterned.

COMPARATIVE EXAMPLE 1

A comparative example was carried out similarly to Example 1, except that the baking temperature of the electroconductive composition was 100° C. The planalizing layer was stripped during the process of coating, developing and rinsing the silicon-containing resist, and thus patterns could not be formed.

COMPARATIVE EXAMPLE 2

A comparative Example 2 was carried out similarly to Example 1, except that MP-1300 resist (Sippley Co.) was coated, instead of an electroconductive composition, as a planalizing layer of 2 nm in thickness, and hard-baked. The resist was subjected to patterning similarly to Example 1. A dislocation of 0.5 $\mu$m was observed at the portions, where electron beams overlapped due to the charge up effect.

EXAMPLE 2

On a substrate the same of as that of Example 1, an electroconductive under layer of 1 $\mu$m in thickness was formed and cured similarly to that of Example 1. An organic resist ZEP-520 (Nippon Zeon Co.) was applied thereon to 0.3 $\mu$m in thickness. Next, the resist was exposed to an electron beam having 15 kV of accelerating voltage with an exposing density of 8 $\mu$C/cm$^2$. Then the exposed resist was developed with an organic developer and rinsed with alcohol. Thus, a line and space of 1.0 to 0.1 $\mu$m was patterned only in the upper layer. The upper layer was transferred to the under layer similarly to Example 1.

No dislocation of the electron beam at the field connecting zone and no strains of image due to approaching effect were observed, and fine patterns of 0.1 μm in width could be resolved.

EXAMPLE 3

Each composition shown in Table 1 was dissolved in a solvent, i.e., a mixture of water/IPA (7:3 by weight ratio) or solely water, spin-coated on a silicon wafer, and baked on a hot plate. Thereafter various solvents were dropped on the formed films, respectively, to observe the solvent resistance of each film. The results are shown in Table 1.

In Table 1, ⊚=no change, ○=several spots of stain observed, Δ=color changed, and ×=dissolved.

reference numbers correspond to the parts as follows: 1: substrate to be subjected to etching, 10: MOS transistor, 11: gate electrode, 12: gate insulating layer, 2: interlayer insulating layer, 3: metallic layer, 4: resist, 50: bulk plasma, 51: ion sheath, 52: electrons, 53: positive ions, 60: substrate loading electrode, 61: source of RF electricity.

Figure 3A:
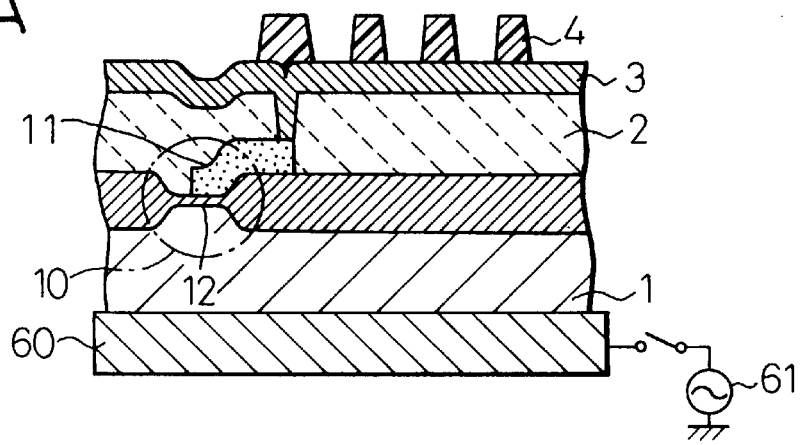
FIGS. 3A to 3E are diagrammatical views of a semiconductor device for illustrating problems of the prior art.

An organic polymer resist 4 is formed as an etching mask on a metallic layer 3, which layer 3 is coated and connected with a gate electrode 11 of MOS transistor. Generally, a resist is an insulator, whose sheet resistance is in the order of $10^{12}$ to $10^{15}$ $\Omega/\square$ (FIG. 3A). When the etching begins, an ion sheath 51 is formed between the substrate 1 to be etched and the bulk plasma 50. The electrode 60, on which the substrate 11 to be etched is mounted, is connected with a source 61 of RF electricity. The deviation of electrical charge is generated due to the difference of moving speed between the electrons 52 and positive ions 53, but in order

TABLE 1

| Electroconductive polymer | | Cross-linking agent | Solvent | Baking temp. (°C.) | Baking time (min) | Estimation of solvent resistance | | | | | |
|---|---|---|---|---|---|---|---|---|---|---|---|
| | | | | | | $H_2O$ | IPA | EtOH | MIBK | Ans | TMAH |
| SPAn | 15% | — | $H_2O$/IPA | 200 | 10 | × | Δ | Δ | Δ | Δ | × |
| P(AAS) | 15% | — | $H_2O$ | 200 | 10 | × | Δ | Δ | Δ | Δ | × |
| P(AAS) | 3% | PVP 10% | $H_2O$/IPA | 200 | 10 | × | Δ | Δ | Δ | Δ | × |
| SPAn | 35 | PVP 10% | $H_2O$/IPA | 200 | 10 | × | Δ | Δ | Δ | Δ | × |
| P(AAS) | 3% | polyester 15% | $H_2O$/IPA | 200 | 10 | Δ | ⊚ | ○ | ○ | ○ | Δ |
| SPAn | 3% | polyester 15% | $H_2O$/IPA | 200 | 10 | Δ | ⊚ | ○ | ○ | ○ | Δ |
| P(AAS) | 12% | PVA 4% | $H_2O$/IPA | 200 | 5 | Δ | ⊚ | ⊚ | ⊚ | ⊚ | Δ |
| P(AAS) | 12% | PVA 4% | $H_2O$/IPA | 200 | 10 | ⊚ | ⊚ | ⊚ | ⊚ | ⊚ | ⊚ |
| P(AAS) | 8% | PVA 7% | $H_2O$/IPA | 200 | 5 | ⊚ | ⊚ | ⊚ | ⊚ | ⊚ | ⊚ |
| SPAn | 8% | PVA 7% | $H_2O$/IPA | 200 | 10 | ⊚ | ⊚ | ⊚ | ⊚ | ⊚ | ⊚ |

SPAn: sulfonated polyaniline
P(AAS): poly(aminoanisole sulfonic acid)
PVP: polyvinyl phenol
PVA: polyvinyl alcohol
IPA: isopropanol
EtOH: ethyl alcohol
MIBK: methyl isobutyl ketone
Ans: anisole
TMAH: 2.38% queous solution of tetra methyl ammonium hydrooxide

EXAMPLE 4

A mixture of poly(aminoanisole sulfonic acid) and polyvinyl phenol was baked on a hot plate under various conditions, and the sheet resistance was estimated by an apparatus for measuring surface resistance. The obtained results were shown in FIGS. 1 and 2.

Figure 2:
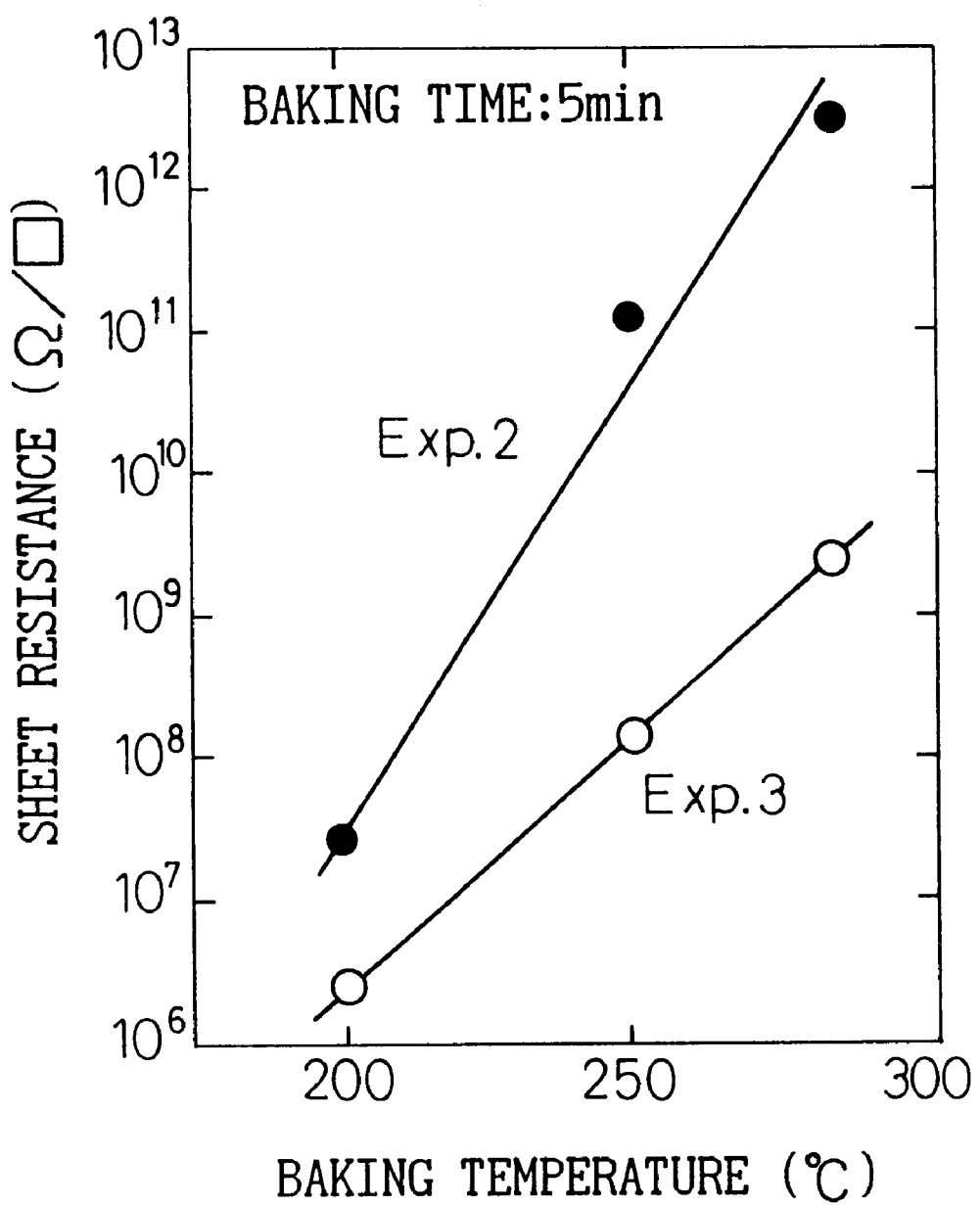
FIG. 2 illustrates the relationship between the baking time and the electroconductivity obtained in the Examples.

FIG. 1 illustrates the relationship between baking time and electroconductivity, and FIG. 2 illustrates the relationship between baking temperature and electroconductivity. Exp's in the Figures represent the following conditions.

Exp. 1→P(AAS):PVA=8:7
Exp. 2→P(AAS):PVA=10:5
Exp. 3→P(AAS):PVA=12:4
Exp. 4→P(AAS):PVA=13:3

EXAMPLE 5

This example relates to a process for preventing the gate oxide layer from being damaged due to charge up during the etching step for producing a semiconductor IC.

At first, the principle of this problem, i.e., so-called electron-shielding effect is described by referring to figures.

Figure 3B:
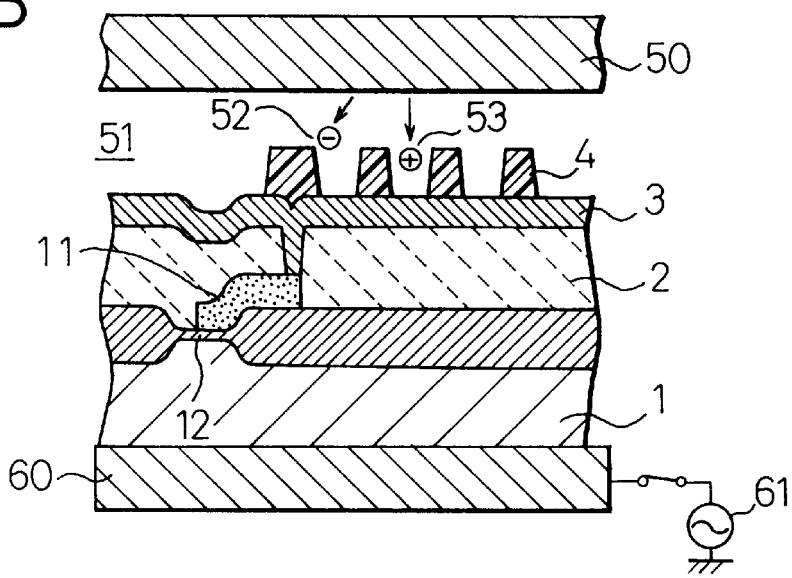

FIGS. 3A to 3E illustrate sectional views of a semiconductor device on which a MOS transistor is mounted. The to satisfy the neutralization law, self bias is formed in that negative potential is generated in the wafer loading electrode 60 against the bulk plasma 50 (FIG. 3B).

When positive ions 53 and electrons 52 flow within the ion sheath 51, the self bias effects as an electrical field for accelerating positive ions and decelerating electrons. Therefore, when they arrive at the substrate 1, the electrons 52, whose kinetic energy is decreased, are easily captured by the resist 4, which is on the uppermost layer of the substrate to be etched and, on the contrary, the positive ions 53 are accelerated to be implanted into the metallic layer 3 to be etched and the ions gradually accumulate.

Figure 3C:
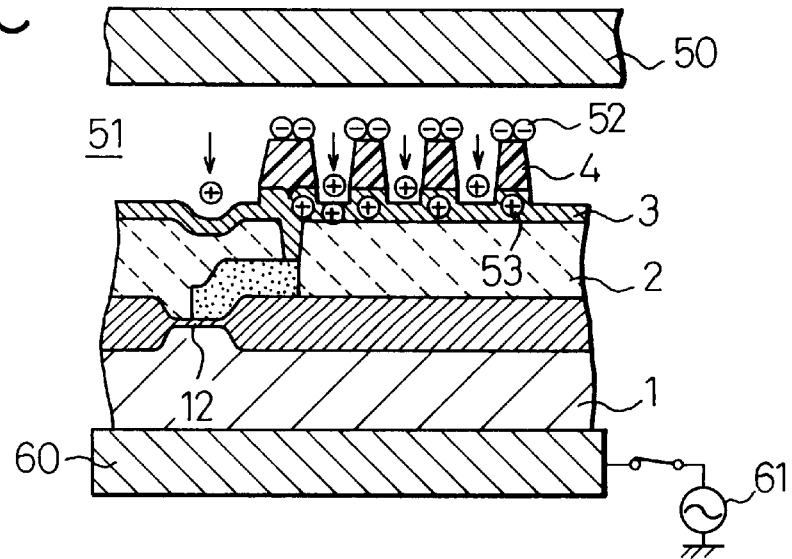

As the electrons 52 are captured in the upper portion of the resist 4, the electrical field above the narrow opening is disturbed, the electrical field oriented toward the substrate becomes a further decelerating electrical field for the electrons 52, which come within the ion sheath 51. In effect, the electrons within the sheath is shielded by the resist which are negatively charged. Therefore, positive and negative electrical charges are polarized with respect to each other by means of the resist 4 (FIG. 3C).

Figure 3D:
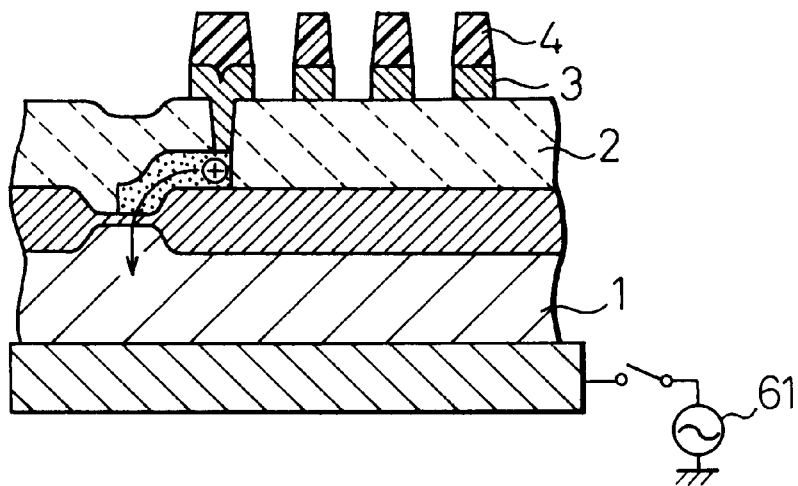
Figure 3E:
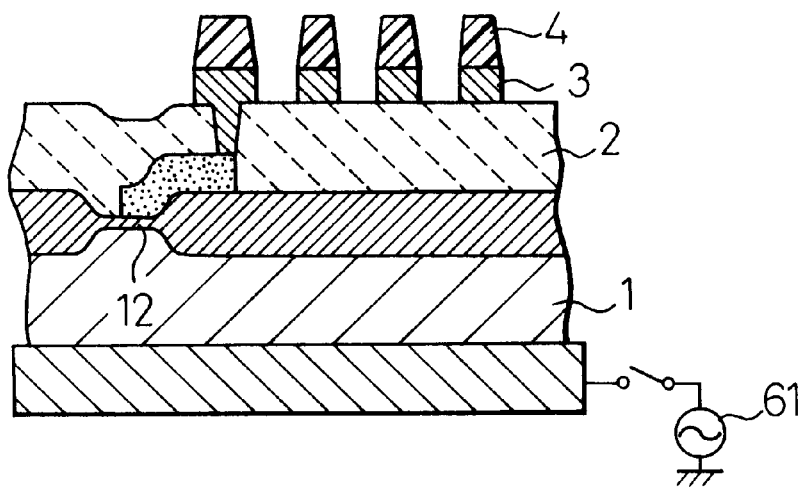

This imbalance of the electrical charge is amplificated within the substrate, while the substrate is exposed to plasma. During etching, when the metallic layer is entirely connected within the substrate, induction relaxation of electrical charge is effected to a certain extent. However, as soon as the etching is completed on the entire region to be etched, the storaged electrical charge flows into the gate electrode 11 (FIG. 3D). MOS transistor 10 is formed by sandwiching a thin insulating layer 12 between the gate electrode 11 and a channel which is controled by the gate electrode. However, the amount of stored electrical charge is often more than the breakdown voltage of the gate, and thus the insulating layer 12 is apt to be broken (FIG. 3E).

Such problem set forth above is resolved by decreasing the sheet resistance of the resist. This principle will be illustrated in FIGS. 4A to 4D, in which reference number 41 depicts an electroconductive polymer.

Figure 4A:
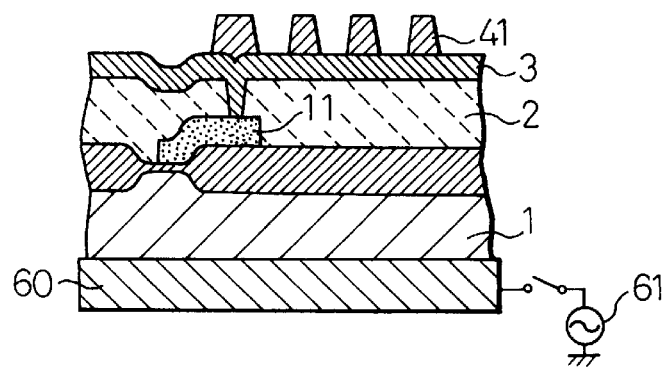
FIGS. 4A to 4D illustrate the principle of the mechanism of the invention.
Figure 4B:
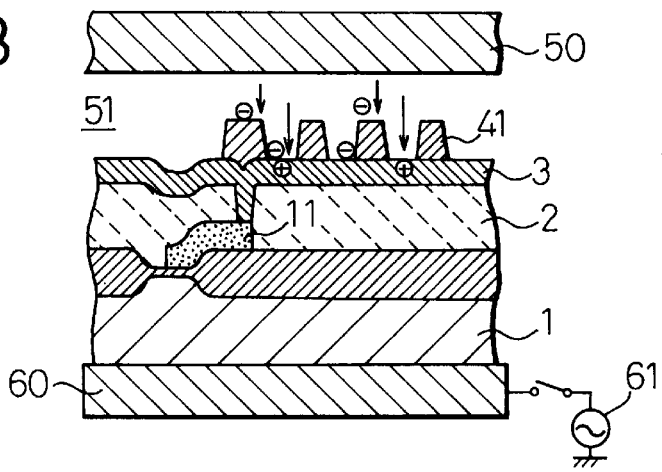
Figure 4C:
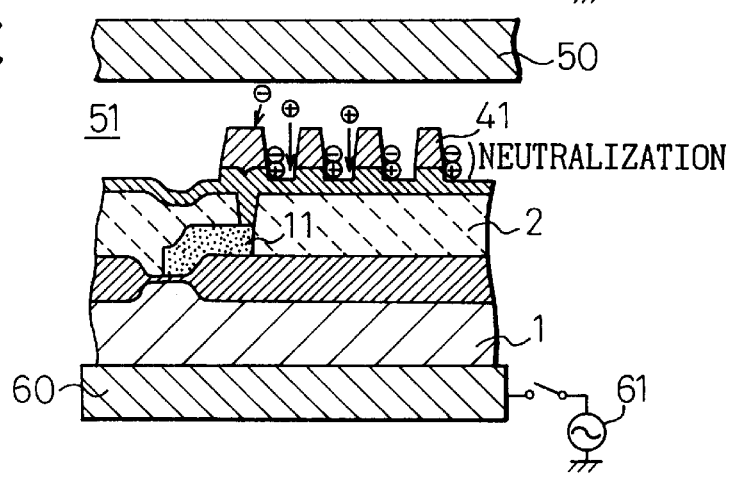

An electroconductive polymer 41 having a sheet resistance of $10^7$ $\Omega/\square$, which is lower than that of the prior art, is coated and patterned on the surface of the metallic layer 3, which in turn is coated on an insulating layer 2 and connected with the gate electrode 11 of MOS transistor 10 (FIG. 4A). As the etching begins, the self bias is generated, so that a negative potential is generated on the electrode 11 loaded on the substrate 1, against the bulk plasma 50. While electrons are captured on the upper portion the resist due to electron shielding effect, the electrons move towards the underlying metallic layer 3 along the surface of the resist 41, due to the high electroconductivity of the resist (FIG. 4B). On the other hand, positive ions, which arrive at the metallic layer 3, and distributed all over the metallic layer 3, and therefore the electrons, which have moved from the resist, are neutralized by the positive ions (FIG. 4C). Thus, there is no polarization of positive and negative electrical charges caused by the resist material. Because electrons do not accumulate on the uppermost portion of the resist, the electron shielding effect is very weak, and the electrons are supplied in an amount sufficient to neutralize the implanted positive ions.

Figure 4D:
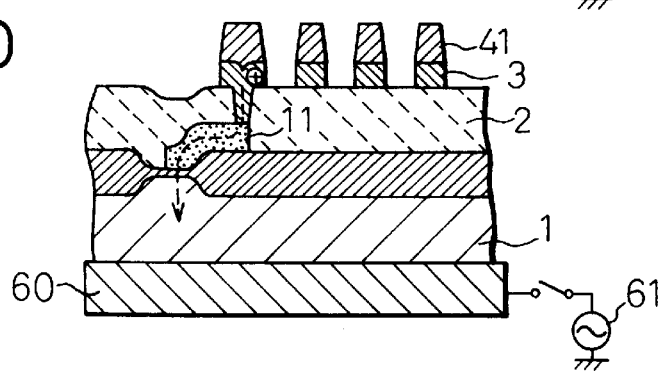

Therefore, there is no charge up within the substrate which is exposed to plasma. When all of the region, which was exposed to plasma, has been completely etched, the amount of the stored electrical charge is very small, and thus the electrical charge, which flows into the gate electrode is very small (FIG. 4D). In other words, the amount of the electrical charge, which is polarized on the gate insulating layer 12 of the MOS transistor, is also very small, and thus the insulating layer is not destroyed.

Figure 5A:
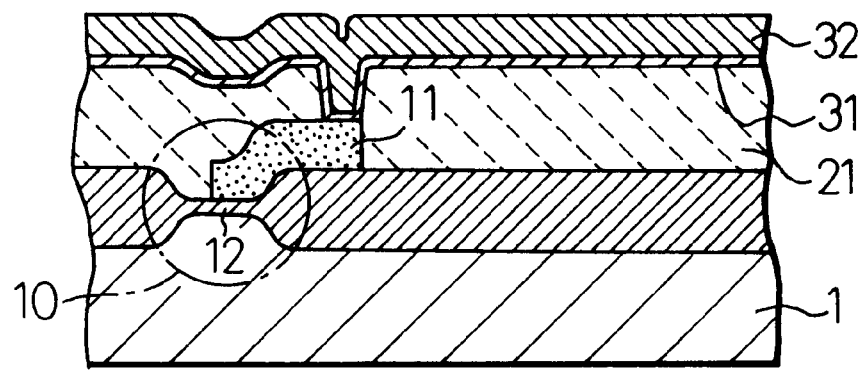
FIGS. 5A to 5B illustrate the construction of an example of the invention.
Figure 5B:
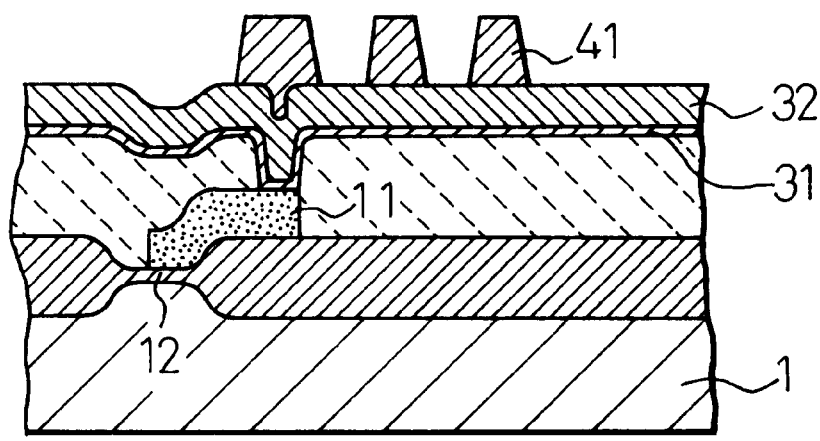

FIGS. 5A to 5B illustrate an example of the invention, in which a barrier metal 31 and an aluminum layer 32 are depicted. A MOS transistor 10 is formed by isolating elements by field oxidation of a silicon substrate 1. An insulating layer 21, e.g., BPSG, is deposited on the gate electrode 11 of the MOS transistor, and then an opening is formed in the insulating layer 21 by means of lithography, in order to lead wiring from the gate electrode 11. Thereafter, a thin film 31, e.g., of TiN, is formed as a barrier metal, on which an Al thin film 32 is deposited to form a main wiring material (FIG. 5A).

In order to make this Al/TiN layer as a wiring pattern, a resist layer is formed for preparing an etching mask on the Al/TiN layer. In this example, the resist is composed of three layers. The electroconductive resist for use as the lower layer (planalizing layer) 41 is formed by baking a composition, which contains 70 parts by weight of sulfonized polyaniline, 30 parts by weight of polyvinyl alcohol (polymerization degree=1,000, sulfonization degree=89%), 800 parts by weight of water, 200 parts by weight of isopropanol (IPA), and 5 parts by weight of a surfactant (polyoxyethylene phenyl ether), at 230° C. for 5 minutes.

Then a siloxane type polymer and a novolac type resist adapted for i-line are sequentially coated as the intermediate layer and the uppermost layer, respectively. The resist of the uppermost layer is patterned by means of an i-line exposure apparatus.

The patterned uppermost layer is used as an etching mask, and the intermediate layer is etched by means of fluorine type plasma, in order to transfer the pattern of the uppermost layer to the intermediate layer. Next, similarly, the pattern of the intermediate layer is transferred to the lower layer by means of oxygen plasma etching. Finally, the intermediate layer is removed by means of fluorine type plasma etching, and thus the etching mask 41 of the electroconductive polymer is completed (FIG. 5B).

The Al/TiN laminated layer, i.e., the layer to be etched, is etched with a chlorine type plasma as the etching mask 41.

The sheet resistances of the obtained electroconductive resists were estimated to be $3 \times 10^7$ $\Omega/\square$ and $1 \times 10^{10}$ $\Omega/\square$, using a novolac type single layer resist ($1 \times 12^{10}$ $\Omega/\square$) as reference.

As a sample construction, a MOS capacitor is prepared, which has a gate oxide layer of 80 nm in thickness, and the existence of damage, when an Al wiring is connected to the gate oxide layer, is estimated by means of I–V characteristic of the MOS capacitor. As the construction of the antenna wiring, the Al wiring is 0.7 μm in thickness, and the resist pattern is 0.59 μm in space and 1.7 μm in height. The aspect ratio of etched wiring is 3.4, including the decrease in thickness of the resist. The etching apparatus is ECR (bias frequency=13.56 MHz).

Figure 6:
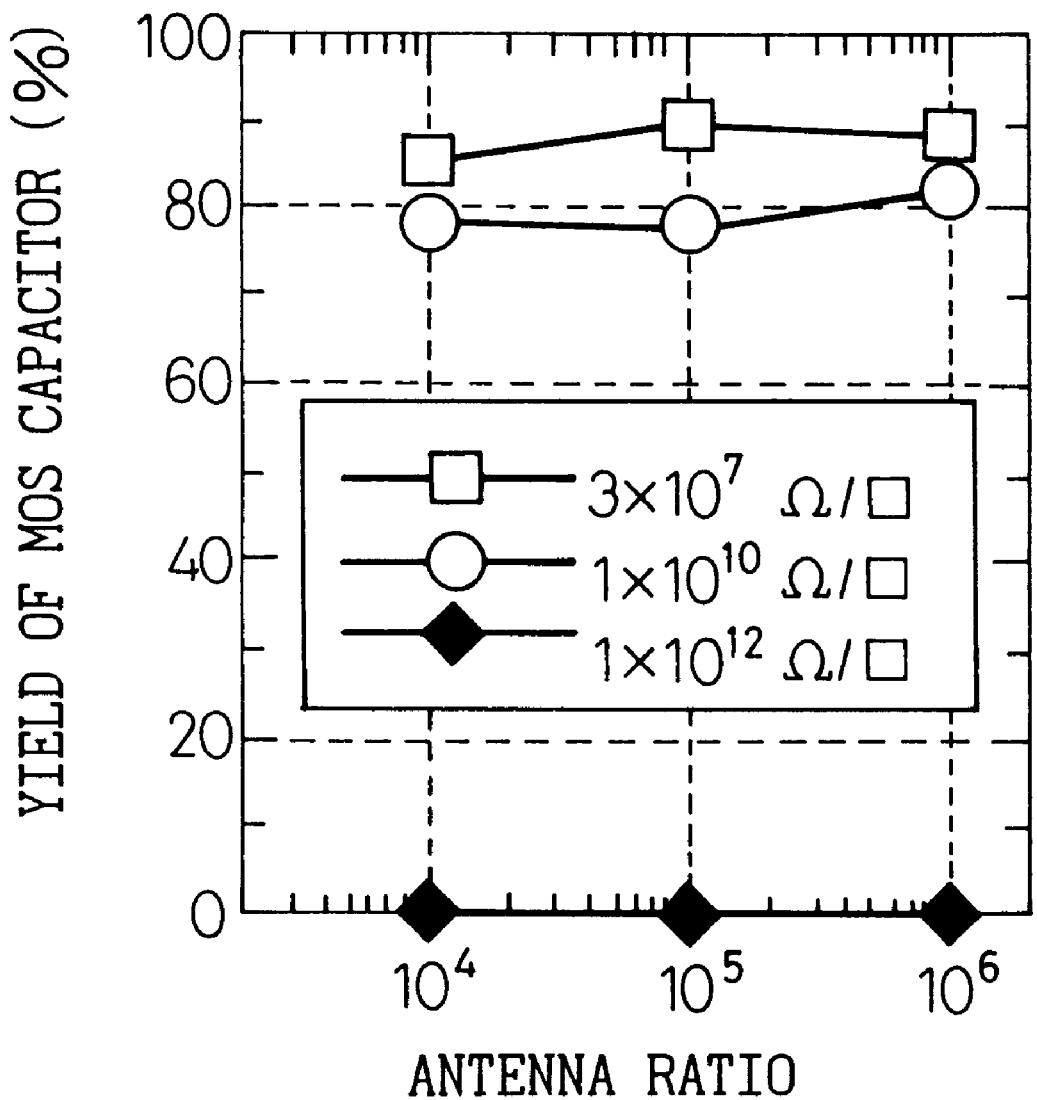
FIG. 6 illustrates the relationship between the good yield and the antenna ratio of MOS capacitors, which are produced by using resists of different sheet resistance.

FIG. 6 illustrates the existence ratio of MOS capacitor samples in which the used resist had various sheet resistance, in relation to the antenna ratio, i.e., wiring area/gate area.

When the gate breakdown happened at Vg≦5V, the gate was estimated to have been ruptured. Even if the sheet resistance was $1 \times 10^{10}$ $\Omega/\square$, its effect was recognized.

We claim:

1. A process for forming a pattern, comprising the steps of:

coating a substrate with a solution comprising 100 parts by weight of a soluble electroconductive polymer containing an organic radical capable of cross-linking with a crosslinking agent, 5 to 1,000 parts by weight of a crosslinking agent, and 100 to 100,000 parts by weight of a solvent as essential ingredients;

crosslinking the resultant coated film to obtain a cured electroconductive film having a sheet resistance of $10^{10}$ $\Omega/\square$ or less;

forming a pattern as an upper layer on said cured electroconductive film, said pattern being formed by coating said substrate with a silicon-containing resist, and effecting exposure and development thereon; and then, transferring the pattern of said upper layer to said cured electroconductive film, wherein said silicon-containing resist comprises a compound having the following general formula (1):

$$(O_{1.5}Si—R^1—SiO_{1.5})_m(O_{0.5}SiR^2{}_3)_n$$

wherein $R^1$ represents a lower arylene or alkylene, $R^2$ represents a lower alkyl, lower aryl, lower alkenyl, lower aralkyl, halogenated alkyl, halogenated aryl, halogenated arylalkyl, and halogenated aralkyl, which may be the same radicals or different radicals.

2. A process for forming a pattern as claimed in claim 1, wherein said electroconductive polymer comprises a sulfonic acid.

3. A process for forming a pattern as claimed in claim 1, wherein said electroconductive polymer is polyaminoanisol sulfonic acid.

4. A process for forming a pattern as claimed in claim 1, wherein said cross-linking agent is polyvinyl alcohol or a copolymer thereof, which has 100 to 2,000 of polymerization degree and 50 to 100% of sulfonification degree.

5. A process for forming a pattern as claimed in claim 1, wherein said solvent contains water, alcohol or a mixture thereof.

6. A process for forming a pattern as claimed in claim 1, wherein 0.01 to 50 parts by weight of a surfactant based on 100 parts by weight of said electroconductive polymer is further contained in said solution.

7. A process for forming a pattern as claimed in claim 1, wherein said upper layer is made from a photosensitive organic resist layer.

8. A process for forming a pattern as claimed in claim 1, wherein said pattern of said upper layer is formed by coating said substrate with a silicon-containing resin layer, and coating a photosensitive resin composition on the coated silicon-containing resin layer, and subjecting said coated substrate to exposure and development in order to effect patterning, and then transferring said pattern to said silicon-containing resin.

9. A process for forming a pattern as claimed in claim 8, wherein the light source of said exposure is of electron beams.

10. A process for forming a pattern as claimed in claim 8, wherein the light source of said exposure is ultraviolet ray, KrF exima laser, ArF exima laser or X ray.

11. A process for forming a pattern as claimed in claim 1, wherein said transferring of said upper layer pattern to said cured electroconductive film is effected by plasma etching with an oxygen-containing gas.

12. A process for producing a reticle, characterized by applying a process for forming a pattern recited in claim 1.

13. A process for forming a reticle as claimed in claim 12, wherein said electroconductive polymer comprises a sulfonic acid.

14. A process for forming a reticle as claimed in claim 12, wherein said electroconductive polymer is polyaminoanisol sulfonic acid.

15. A process for forming a reticle as claimed in claim 12, wherein said cross-linking agent is polyvinyl alcohol or a copolymer thereof, which has 100 to 2,000 of polymerization degree and 50 to 100% of sulfonification.

16. A process for a reticle as claimed in claim 12, wherein said solvent contains water, alcohol or a mixture thereof.

17. A process for forming a reticle as claimed in claim 12, wherein 0.01 to 50 parts by weight of a surfactant based on 100 parts by weight of said electroconductive polymer is further contained in said solution.

18. A process for forming a reticle as claimed in claim 12, wherein said upper layer is made from a photosensitive organic resist layer.

19. A process for forming a reticle as claimed in claim 12, wherein said pattern of said upper layer is formed by coating said substrate with a silicon-containing resin layer, and coating a photosensitive resin composition on the coated silicon-containing resin layer, and subjecting said coated substrate to exposure and development in order to effect patterning, and then transferring said pattern to said silicon-containing resin.

20. A process for forming a reticle as claimed in claim 19, wherein the light source of said exposure is of electron beams.

21. A process for forming a reticle as claimed in claim 19, wherein the light source of said exposure is ultraviolet ray, KrF exima laser, ArF exima laser or X ray.

22. A process for forming a reticle as claimed in claim 12, wherein said transferring of said upper layer pattern to said cured electroconductive film is effected by plasma etching with an oxygen-containing gas.

23. A process for producing a semiconductor device, comprising the steps of:

forming a gate electrode of a MOS transistor;

coating said gate electrode with an insulating layer, and forming an opening in said insulating layer so as to form electrical connection with said gate electrode;

coating a first film comprising an electroconductive material or a metal which is electrically connected with said gate electrode through said opening; and, etching said first film with a resist formed on said first film as an etching mask, to form an interconnection made of said first film, wherein said resist is patterned by a process as recited in claim 1.

24. A process for producing a semiconductor device as claimed in claim 23, wherein said electroconductive polymer comprises a sulfonic acid.

25. A process for producing a semiconductor device as claimed in claim 23, wherein said electroconductive polymer is polyaminoanisol sulfonic acid.

26. A process for producing a semiconductor device as claimed in claim 23, wherein said cross-linking agent is polyvinyl alcohol or a copolymer thereof, which has 100 to 2,000 of polymerization degree and 50 to 100% of sulfonification.

27. A process for producing a semiconductor device as claimed in claim 23, wherein said solvent contains water, alcohol or a mixture thereof.

28. A process for producing a semiconductor device as claimed in claim 23, wherein 0.01 to 50 parts by weight of a surfactant based on 100 parts by weight of said electroconductive polymer is further contained in said solution.

29. A process for producing a semiconductor device as claimed in claim 23, wherein said upper layer is made from a photosensitive organic resist layer.

30. A process for producing a semiconductor device as claimed in claim 23, wherein said pattern of said upper layer is formed by coating said substrate with a silicon-containing resin layer, and coating a photosensitive resin composition on the coated silicon-containing resin layer, and subjecting said coated substrate to exposure and development in order to effect patterning, and then transferring said pattern to said silicon-containing resin.

31. A process for producing a semiconductor device as claimed in claim 30, wherein the light source of said exposure is of electron beams.

32. A process for producing a semiconductor device as claimed in claim 30, wherein the light source of said exposure is ultraviolet ray, KrF exima laser, ArF exima laser or X ray.

33. A process for producing a semiconductor device as claimed in claim 23, wherein said transferring of said upper layer pattern to said cured electroconductive film is effected by plasma etching with an oxygen-containing gas.

* * * * *